United States Patent [19]

Chaffin, III

[11] 4,009,300

[45] Feb. 22, 1977

[54] PREPARATION OF GRADED COMPOSITION PROTECTIVE COATINGS

[75] Inventor: John H. Chaffin, III, Minnetonka, Minn.

[73] Assignee: Honeywell Inc., Minneapolis, Minn.

[22] Filed: Oct. 16, 1974

[21] Appl. No.: 515,140

[52] U.S. Cl. .............................. 427/162; 427/255
[51] Int. Cl.² ..................... B05D 1/34; G02B 1/10
[58] Field of Search ............... 350/61, 319, 320, 1, 350/2; 427/162, 164, 166, 248, 255; 428/539

[56] References Cited

UNITED STATES PATENTS

| | | | |
|---|---|---|---|
| 2,512,257 | 6/1950 | Pfand | 427/162 |
| 2,561,077 | 7/1951 | Tilton | 427/248 |
| 2,668,478 | 2/1954 | Schröder | 350/1 |
| 2,700,002 | 1/1955 | Strong | 427/255 |
| 3,271,179 | 9/1966 | Smith | 427/166 |

FOREIGN PATENTS OR APPLICATIONS 1,088,629  10/1967  United Kingdom

OTHER PUBLICATIONS

Strong, John, Concepts of Classical Optics, W. H. Freeman, 1958, pp. 251–252.
F. Horrigan, et al., "Windows for High Power Lasers" *Microwave* pp. 68–75, 1969.
Sparks, "Optical Distortion by Heated Windows in High Power Laser Systems," J. Appl. Phys., vol. 42, pp. 5029–5046 (1971).
Kennedy, "Gas Scattering and Ion Plating Deposition Methods" *Research/Development*, Nov. 1971, pp. 40–44.

*Primary Examiner*—James R. Hoffman
*Attorney, Agent, or Firm*—David R. Fairbairn

[57] ABSTRACT

Graded composition protective layers are prepared for water soluble optical elements. The two materials forming the graded composition protective layer are vapor deposited in the presence of a third vapor which does not react or co-deposit with the two materials. The third vapor inhibits decomposition of one of the two materials by reducing the vapor temperature of the other material.

11 Claims, 3 Drawing Figures

PREPARATION OF GRADED COMPOSITION PROTECTIVE COATINGS

ORIGIN OF THE INVENTION

The present invention was made under a contract with the Department of Defense.

REFERENCE TO CO-PENDING APPLICATIONS

Reference is made to a co-pending application now U.S. Pat. No. 3,959,548 by Enrique Bernal G., entitled "Graded Composition Coating for Surface Protection of Halide Optical Elements", which was filed on even date (Oct. 16, 1974) with this application, and which is assigned to the same assignees as this application.

BACKGROUND OF THE INVENTION

This invention is concerned with surface protection of halide solids. In particular, the present invention is concerned with the surface protection of water soluble halide solids for use as optical components in infrared systems.

One of the more critical problems encountered in the development of high power infrared lasers is the development of laser windows which are highly transparent to laser radiation at 10.6 microns and at 3 to 5 microns. At the present time, considerable research effort has been devoted to the development of laser windows from the so-called covalent compounds consisting typically of II-VI compounds such as cadmium telluride, zinc telluride, and zinc selenide. The need for improved laser window materials, however, is well known. See, for example, F. Horrigan, et al, "Windows for High Power Lasers" *Microwaves*, page 68 (January, 1969); M. Sparks, "Optical Distortion by Heated Windows in High Power Laser Systems", *J. Appl. Phys.*, 42, 5029 (1971).

The need for improved laser windows is based on the extremely high laser power throughput required and the fact that laser windows constitute structural members. In order to maintain high throughput and minimize adverse effects, the amount of energy transferred to the window must be kept low. Laser beam energy can be transferred to the window in two ways: heating of the window caused by either bulk or surface absorption of the beam, or direct conversion of the beam energy to mechanical energy by brillouin scattering or electrostriction. This energy transfer produces several undesirable effects such as lensing and birefringence, which result in degradation of beam quality and polarization. In extreme cases, severe thermal stresses can be produced in the windows. These stresses, which are further aggravated by the fact that the windows are mounted in a cooling clamp, may lead to fracture of the windows.

The low absorption coefficients of the halides make then outstanding candidates for optical components in infrared systems. The alkali halides exhibit low absorption from the near ultraviolet to beyond 10.6 microns, and the alkaline earth halides exhibit low absorption in the 2 to 6 micron region. Furthermore, because the temperature coefficient of the index of refraction and the coefficient of thermal expansion have opposite signs, the two effects tend to compensate optical path changes due to temperature, making these materials useful in applications in which heating by a laser beam is anticipated.

Two fundamental problems with the halides, however, have limited their use as high power laser windows. First halide crystals have low yield strengths and are highly susceptible to fracture. Second, many halides, in particular the alkali halides, are water soluble and cannot, therefore, be used in humid environments.

The first problem has recently been overcome. Techniques for strengthening halides by hot working without altering their optical properties have been developed. These techniques are described in U.S. Patent Applications Ser. No. 634,394 filed Nov. 24, 1975 which is a continuation of Ser. No. 445,371 filed Feb. 25, 1974 and now abandoned; Ser. No. 619,264 filed Oct. 10, 1975 which is a continuation of Ser. No. 445,394 filed Feb. 25, 1974 and now abandoned; and Ser. No. 617,350 filed Sept. 29, 1975 which is a continuation of Ser. No. 445,393 filed Feb. 25, 1974 and now abandoned. These patent applications are assigned to the same assignee as this application.

Despite extensive research efforts, the second problem, surface protection, has not previously been satisfactorily overcome. Conventional coating methods for sealing the surface of the halide solid from environmental humidity have generally failed for one of two reasons. First, the coatings delaminate during thermal cycling because of differences of coefficient of thermal expansion between the coating material and the substrate. This is a serious problem because the large coefficient of thermal expansion of halides tends to result in coatings that are in tension. It has not been uncommon for the protective coating to peel off of a halide window during use. Second, the coating material is sufficiently opaque in the infrared to negate the extremely low optical loss which makes the halides attractive.

In the previously mentioned co-pending application now U.S. Pat. No. 3,959,548 by Enrique Bernal G. entitled "Graded Composition Coating for Surface Protection of Halide Optical Elements", the shortcomings of the prior protective coatings have been overcome. The protective layer taught in that application comprises an alloy of a first water soluble, halide material and a second material which is essentially insoluble in water. The composition of the protective layer varies from essentially the first halide material at the interface of the protective layer and the body to be protected, to the second material at the opposite surface of the protective layer.

Initial experiments which attempted to prepare protective layers of the type described by Enrique Bernal G. utilized thallium iodide (TlI) — potassium chloride (KCl) protective layers on KCl substrates. Thallium iodide was chosen as the second material because it has a very low absorption coefficient at the wavelengths of interest (10.6 microns) and is essentially water insoluble. Graded composition TlI-KCl protective layers were prepared on KCl substrates by vapor deposition. KCl and TlI were co-deposited in a vacuum from two independently heated crucibles. KCl alone was first deposited onto a cleaved single-crystal KCl substrate at room temperature. After a period of time, the KCl deposition was reduced to zero. During this transition interval the TlI deposition was smoothly increased to its predetermined steady state value and maintained for the remainder of the deposition run.

The films prepared by this method exhibited absorption coefficients at 10.6 microns of about 25 cm$^{-1}$. This was much higher than for pure TlI films discretely deposited on KCl, which had exhibited absorption coefficients of less then 1 cm$^{-1}$ at 10.6 microns.

SUMMARY OF THE INVENTION

It has been discovered that the problem of absorption in the alloy films which was higher than in pure thallium iodide films was due to a halogen deficiency in the alloy region of the protective layer. It was then hypothesized that the halogen deficiency was due to the difference in temperature between the relatively hot (475° C) KCl vapor and the relatively cool (250° C) TlI vapor. The KCl vapor, during the condensation process, apparently was causing the TlI to decompose.

This problem has been overcome by the method of the present invention. The present method is applicable to any vapor deposition process in which an alloy of a first and a second material is to be deposited and in which the vapor temperature of the first material is high enough to cause decomposition of the second material. In the present invention, decomposition is inhibited by vapor depositing the first and second materials in the presence of a third vapor which does not react or co-deposit with the first and second materials.

DETAILED DESCRIPTION OF THE PREFERRED EMBODIMENT

The present invention has been used to successfully prepare TlI-KCl alloy layers of graded composition and low optical absorption. While the invention is particularly useful for the preparation of graded composition protective layers for halide optical elements, it may be used whenever (1) it is desired to deposit an alloy of at least a first and second material and (2) the vapor temperature of the first material is high enough to cause decomposition of the second material.

For the purpose of describing the invention, TlI-KCl alloy layers deposited on pure KCl substrates will be described. It will be recognized, however, that other substrate materials including NaCl, alkali halide alloys such a KCl-KBr or KCl-RbCl or any number of other substrate materials may be used. Similarly, although TlI is selected as the material to be alloyed with KCl in the protective layer, many other materials may also be used. Some of these materials are described in the co-pending application now U.S. Pat. No. 3,959,548 by Enrique Bernal G.

Figure 1:
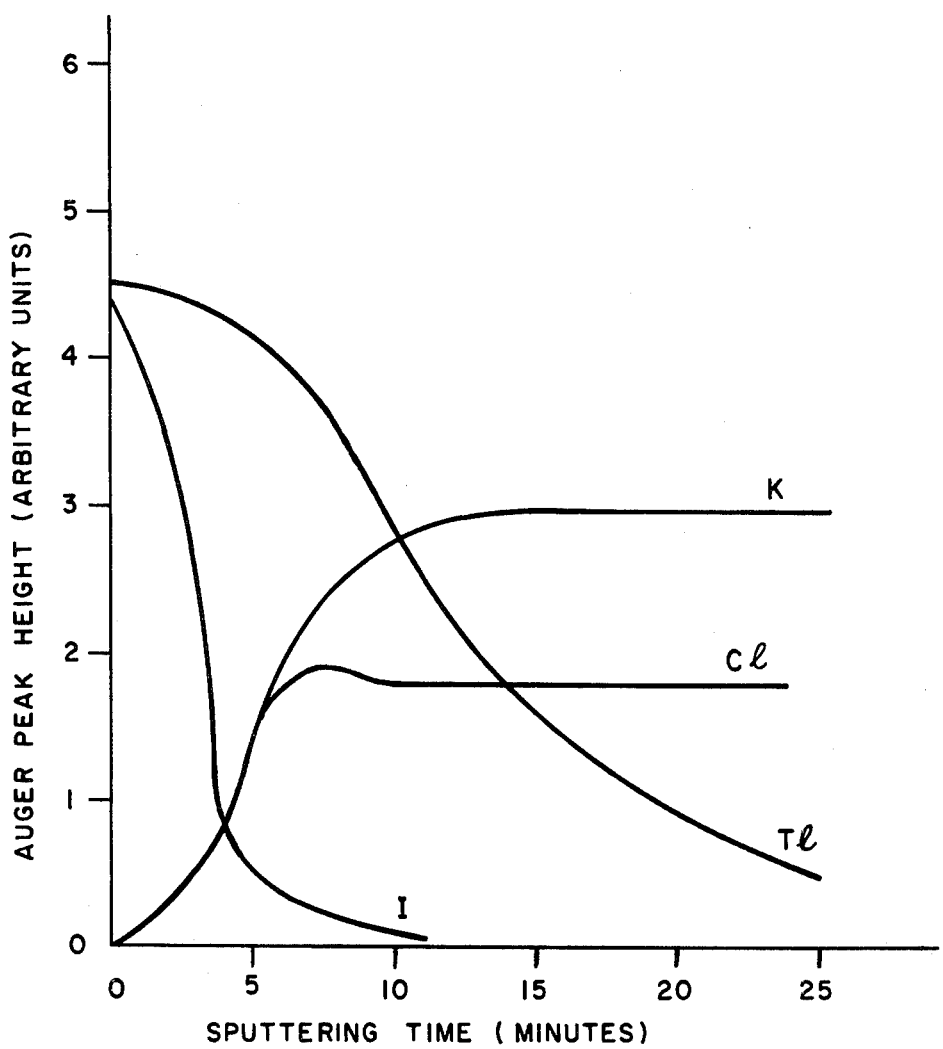
FIG. 1 shows composition as the function of thickness for a graded composition layer of TlI-KCl in which KCl and TlI were deposited in a vacuum.

As described previously, initial attempts to form TlI-KCl protective layers on KCl substrates resulted in films having absorption coefficients which were much higher than that for pure TlI films discretely deposited on KCl. This problem of higher absorption in the alloy films was found to be due to a halogen deficiency in the alloyed region of the protective layer. FIG. 1 is a composition profile of the alloy film obtained by Auger electron spectroscopy (AES). Composition is shown in terms of Auger peak height, and distance from the outer surface is shown in terms of sputtering time. FIG. 1 clearly shows that the thallium to iodine ratio was not constant, and that the film was halogen deficient. The higher optical absorption in the alloyed films deposited in a vacuum was due to this halogen deficiency in the alloy region.

It has been discovered that the halogen deficiency was due to the difference in temperature between the relatively hot (475° C) KCl vapor condensing at the same time as the relatively cool (250° C) TlI vapor. The KCl vapor apparently was causing the TlI to decompose.

The present invention has overcome this decomposition problem. The present invention utilizes a technique known as "inert gas scattering". This technique has been used in the past for increasing the "throwing power" of vapor deposition systems and for increasing thickness uniformity. See, for example, K.D. Kennedy, et al, "Gas-Scattering and Ion-Plating Deposition Methods", Research/Development, page 40, (November, 1971). The throwing power is the ability to coat an irregularly shaped object. Inert gas scattering, however, has not previously been used to inhibit decomposition of one material of an alloy caused by the high vapor temperature of another material of the alloy.

In the present invention, KCl and TlI were deposited in an inert argon atmosphere. The films were prepared by first evacuating the bell jar to 5×10$^{-7}$ torr and then admitting argon through a needle valve until the pressure reached 1×10$^{-4}$ torr. The "spectroscopically pure" argon was first passed over an 850° C titanium strip before admission into the bell jar in order to further reduce reactive contaminants. Argon pressures higher than 1×10$^{-4}$ torr were obtained by throttling the diffusion pump with the high-vac valve. Bell jar pressures over the range (1–10) × 10$^{-4}$ torr were measured with a standard ionization gage, and the pressure at the diffusion pump inlet was monitored by a similar device. The KCl and TlI were co-deposited from two independently heated crucibles. The deposition rate versus crucible heater current for the TlI crucible and for KCl crucible were first determined. The two independent crucible heater currents were then manipulated during deposition. KCl alone was first deposited onto a cleaved single-crystal KCl substrate at room temperature. After a period of time, the KCl deposition was reduced to zero. During this transition period, the TlI deposition was smoothly increased to its predetermined steady state value and maintained for the remainder of the deposition run.

Figure 2:
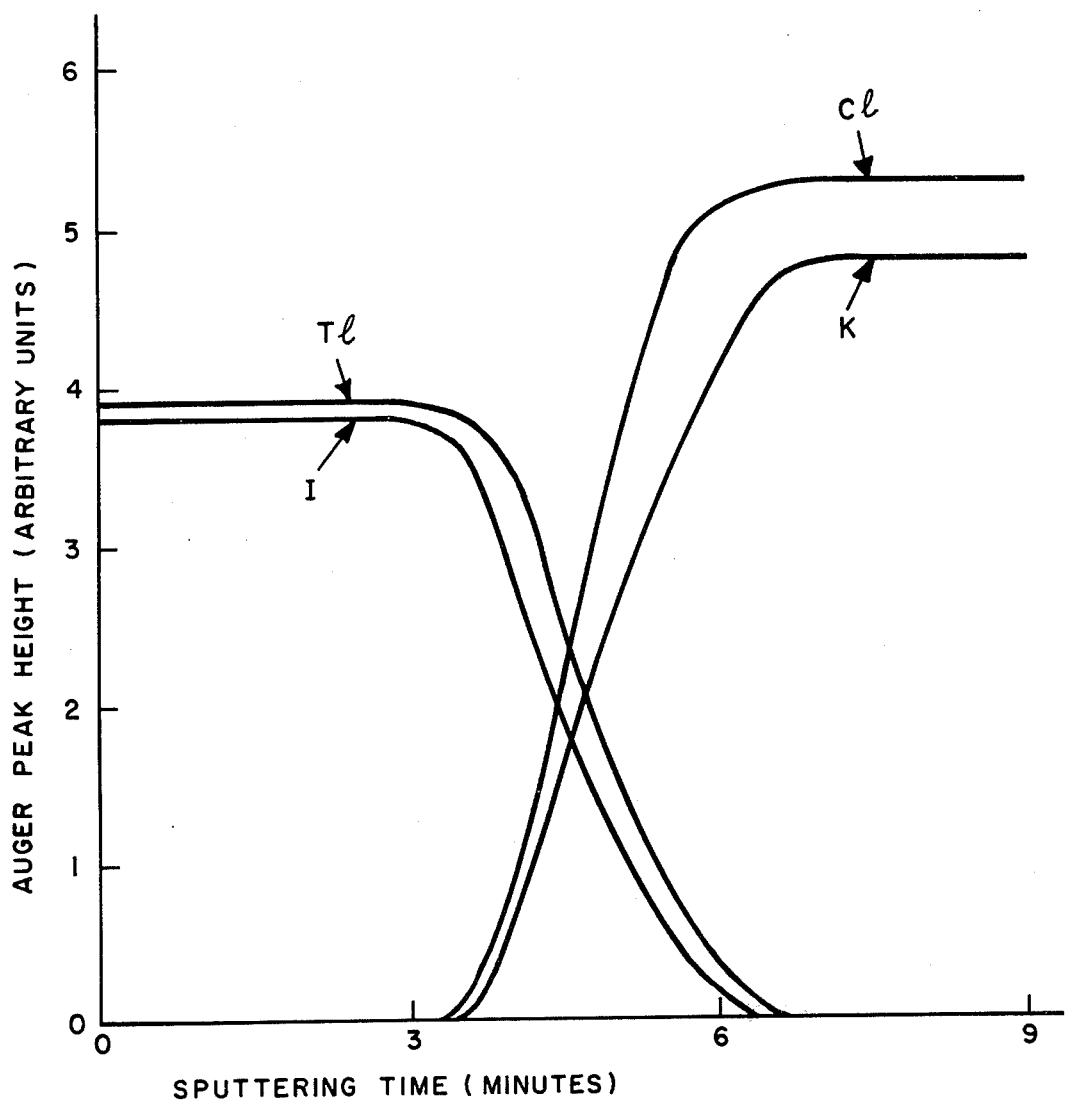
FIG. 2 shows composition as a function of thickness for a graded composition TlI-KCl layer in which KCl and TlI were deposited in the presence of argon.

FIG. 2 shows an AES profile of a TlI-KCl protective layer deposited by the method of the present invention in an argon atmosphere of 4×10$^{-4}$ torr. The initial deposit of KCl was about 500A thick, the alloy region was about 1500A thick, and the pure TlI region was about 1500A thick.

It can be seen that the protective layer uniformly varies from pure KCl to pure TlI as a function of thickness. It is also clear that the halogen deficiency problem has been overcome. The metal-halogen ratios for both TlI and KCl are reasonably constant throughout.

Tests of the absorption coefficient of films formed by the method of the present invention indicated that halogen deficiency was the cause of the higher absorption coefficients in the vacuum deposited films. The 10.6 micron absorption of alloy films formed by the method of the present invention was not measurable with out calorimeter when KCl substrates with absorption coefficients near 1×10$^{-3}$ cm$^{-1}$ were used. The inert argon atmosphere was effective in inhibiting decomposition of TlI because it caused a reduction in the effective vapor temperature of each vapor species (i.e., TlI and KCl). This cooling was achieved by multiple collisions with the inert gas, thereby reducing or eliminating the decomposition problem.

As expected, the vapor deposition in the presence of argon also increased the throwing power of the deposition system and resulted in more uniform films. This greater uniformity results because the collision of the argon with KCl and TlI molecules had a randomizing effect on the direction of vapor deposition.

In order to determine the effect of argon pressure on deposition of TlI and KCl, pure TlI and pure KCl films were evaporated on KCl substrates in a tenuous argon atmosphere at pressures from $1 \times 10^{-4}$ torr to $8 \times 10^{-4}$ torr. The substrate temperature was 60° C, and the cruciblesubstrate distance was 40 cm.

Figure 3:
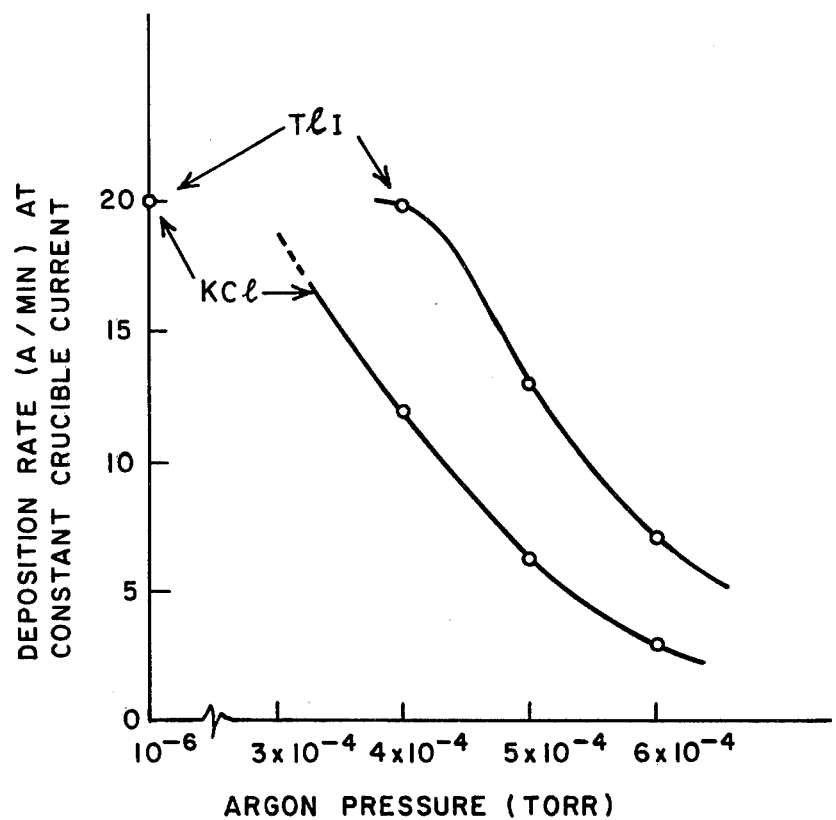
FIG. 3 shows deposition rates at constant crucible temperature for KCl and TlI as a function of argon pressure.

The films were clear and adherent up to pressures of $7 \times 10^{-4}$ torr, but at $8 \times 10^{-4}$ torr the TlI films become very cloudy. The deposition rate of each material is lowered by the scattering effect of the argon as shown in FIG. 3, but as a practical matter this can be compensated for by increasing the crucible heater current. FIG. 3 shows that KCl is scattered more efficiently than TlI, and this is to be expected because the KCl molecule is significantly lighter than the TlI molecule. The bell jar as well as the base plate of the deposition system are rather uniformly coated by these materials at argon pressures above $3 \times 10^{-4}$ torr, providing visual evidence that a great deal of scattering is taking place. The absorption at 10.6 microns for these films, as measured calorimetrically, was found to be unaffected by the argon at pressures up to $6 \times 10^{-4}$ torr. Based upon these experiments, the preferred pressures when argon is used in the present invention are about $1 \times 10^{-4}$ torr to about $6 \times 10^{-4}$ torr.

In conclusion, graded composition protective coatings for halide optical elements have been prepared. By depositing the materials forming the protective coating in an inert atmosphere, low infrared absorption of the films has been achieved.

Although the present invention has been described with reference to a series of preferred embodiments, skilled workers will recognize that modifications and changes can be made without departing from the spirit and scope of the present invention. For example, although the specific atmosphere described has been argon, it can be seen that other vapor species and pressures may also be used. The requirements for the selection of the vapor species are that the material must not react or co-deposit with the materials to be deposited. Suitable vapor species will differ, therefore, depending on the particular materials which will be deposited. Vapor pressures will also differ depending upon the particular materials chosen.

The embodiments of the invention in which an exclusive property or right is claimed are defined as follows:

1. In a method of vapor depositing an optical coating which is an alloy of at least a first and a second halide compound material, and wherein the vapor temperature of the first material is high enough to cause decomposition of the second material, the improvement comprising:

vapor depositing the first and second materials in the presence of a third vapor which does not chemically react or co-deposit with the first and second materials; wherein the third vapor is present in an amount sufficient to cause, as a result of collisions between the vapor of the first material and the third vapor, a reduction in the vapor temperature of the first material to a temperature which will not cause substantial decomposition of the second material.

2. The invention of claim 1 wherein the first material is KCl.

3. The invention of claim 2 wherein the second material is TlI.

4. The invention of claim 3 wherein the third vapor is argon.

5. The invention of claim 4 wherein the argon has a vapor pressure of between about $1 \times 10^{-4}$ torr and about $6 \times 10^{-4}$ torr.

6. A method of preparing a protective coating for an optical element of a first, water soluble halide material, the method comprising:

vapor depositing the first material and a second, water insoluble halide material in the presence of a third vapor which does not react or co-deposit with the first and second materials; wherein the vapor temperature of the first material, in the absence of the third vapor, is sufficient to cause decomposition of the second material, and wherein the third vapor is present in an amount sufficient to inhibit decomposition of the second material by reducing the vapor temperature of the first material; and decreasing the amount of the first material being deposited while increasing the amount of the second material being deposited until only the second material is being deposited.

7. The method of claim 6 wherein the second material is thallium iodide.

8. The method of claim 7 wherein the first material is of the group consisting of alkali halides and alloys thereof.

9. The method of claim 8 wherein the first material is potassium chloride.

10. The method of claim 9 wherein the third vapor is argon.

11. The method of claim 10 wherein the argon has a vapor pressure of between $1 \times 10^{-4}$ torr and about $6 \times 10^{-4}$ torr.

* * * * *